(12) United States Patent
Ho et al.

(10) Patent No.: US 9,046,568 B2
(45) Date of Patent: Jun. 2, 2015

(54) UNIVERSAL SPRING CONTACT PIN AND IC TEST SOCKET THEREFOR

(75) Inventors: Chee-Wah Ho, Fremont, CA (US);
Nasser Barabi, Lafayette, CA (US)

(73) Assignee: Essai, Inc., Fremont, CA (US)

( * ) Notice: Subject to any disclaimer, the term of this patent is extended or adjusted under 35 U.S.C. 154(b) by 1116 days.

(21) Appl. No.: 12/873,959

(22) Filed: Sep. 1, 2010

(65) Prior Publication Data

US 2011/0057676 A1    Mar. 10, 2011

Related U.S. Application Data

(63) Continuation-in-part of application No. 12/749,297, filed on Mar. 29, 2010, now Pat. No. 8,493,085.

(60) Provisional application No. 61/239,028, filed on Sep. 1, 2009, provisional application No. 61/164,335, filed on Mar. 27, 2009.

(51) Int. Cl.
| | | |
|---|---|---|
| *G01R 1/067* | (2006.01) | |
| *G01R 31/00* | (2006.01) | |
| *G01R 31/28* | (2006.01) | |
| *G01R 1/04* | (2006.01) | |

(52) U.S. Cl.
CPC .............. *G01R 31/286* (2013.01); *G01R 1/067* (2013.01); *G01R 1/0408* (2013.01); *G01R 1/06722* (2013.01)

(58) Field of Classification Search
CPC ........... G01R 1/06738; G01R 1/06727; G01R 1/06733; G01R 1/06744; G01R 1/06755; G01R 1/06772; G01R 1/06788; G01R 1/06722; G01R 1/07342; H01R 12/714; G01N 24/08
USPC ............................ 324/755.01, 755.04–755.11
See application file for complete search history.

(56) References Cited

U.S. PATENT DOCUMENTS

| | | | |
|---|---|---|---|
| 4,161,692 A | 7/1979 | Tarzwell | |
| 5,523,696 A | 6/1996 | Charlton et al. | |
| 5,557,213 A * | 9/1996 | Reuter et al. ............. | 324/755.05 |
| 5,600,259 A | 2/1997 | Bartyzel et al. | |
| 6,046,597 A * | 4/2000 | Barabi ..................... | 324/756.02 |
| 6,208,155 B1 | 3/2001 | Barabi et al. | |
| 6,773,312 B2 | 8/2004 | Bauer et al. | |
| 6,980,013 B2 * | 12/2005 | Machida et al. ......... | 324/754.03 |
| 7,351,121 B2 * | 4/2008 | Xu .................................. | 439/824 |
| 7,402,995 B2 * | 7/2008 | Adachi et al. ............ | 324/757.01 |
| 2007/0018666 A1 | 1/2007 | Barabi et al. | |

* cited by examiner

*Primary Examiner* — Vinh Nguyen

(74) *Attorney, Agent, or Firm* — Beeson Skinner Beverly, LLP

(57) ABSTRACT

A universal spring contact pin for use in an IC test Socket includes a depressible probe member at one end and a fixed probe member at the other end. The fixed probe member preferably has a projection length chosen to allow z-axis loading of different surface mount package types within the same test socket. It also can have a relatively large tip angle which preferably terminates at a relatively sharp termination point. Preferably, the tip angle is about 90 degrees and the radius of the termination point of the tip is about 0.001 inches (0.0254 millimeters) or less.

29 Claims, 5 Drawing Sheets

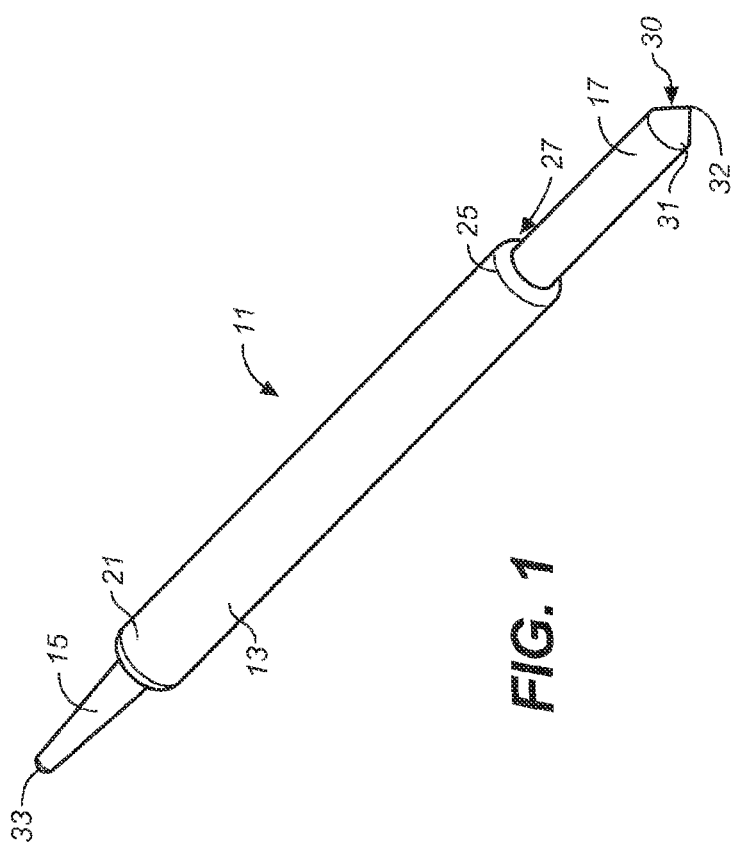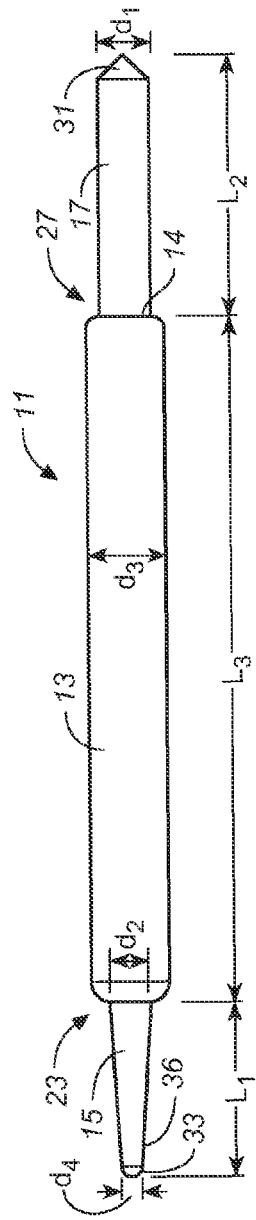

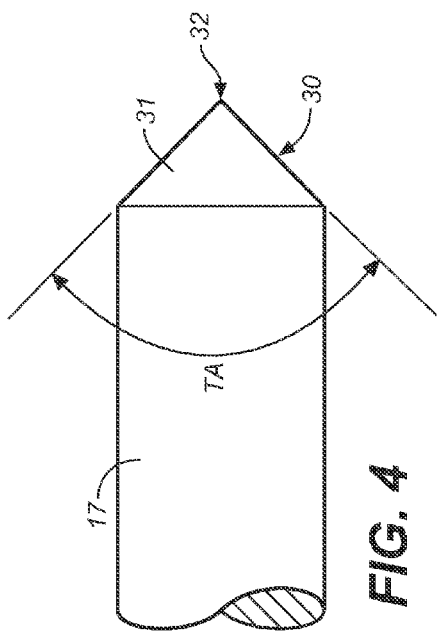
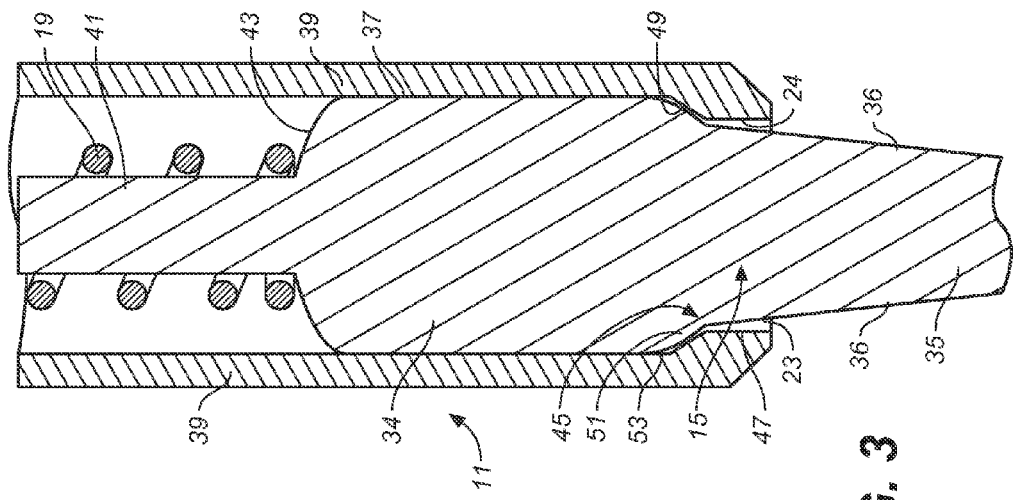

UNIVERSAL SPRING CONTACT PIN AND IC TEST SOCKET THEREFOR

CROSS-REFERENCE TO RELATED APPLICATIONS

This application is a continuation-in-part of U.S. non-provisional application Ser. No. 12/749,297 filed Mar. 29, 2010, now pending, which claims the benefit of U.S. provisional application No. 61/164,335 filed Mar. 27, 2009, and all of which are incorporated herein by reference, and this application claims the benefit of U.S. provisional application No. 61/239,028 filed Sep. 1, 2009.

FIELD OF THE INVENTION

The present invention generally relates to test sockets, contactors and the like for testing and burn-in of integrated circuit (IC) devices, and to spring contact pins used in test sockets and contactors to make circuit connections between IC devices and a test or burn-in circuit board. IC devices will sometimes be referred to herein as simply "chips" or "IC chips." "IC test socket" means any device for testing an IC chip that provides and interface between the chips being tested and a test circuit.

DESCRIPTION OF THE DRAWINGS

FIG. 1 is a perspective view of a spring contact pin in accordance with the invention.

FIG. 2 is a side elevational view thereof.

FIG. 3 is a fragmentary sectional view thereof showing the depressible probe member in greater detail;

FIG. 4 is a fragmentary view thereof showing the fixed probe tip in greater detail.

DESCRIPTION OF ILLUSTRATED EMBODIMENTS

Figure 5:
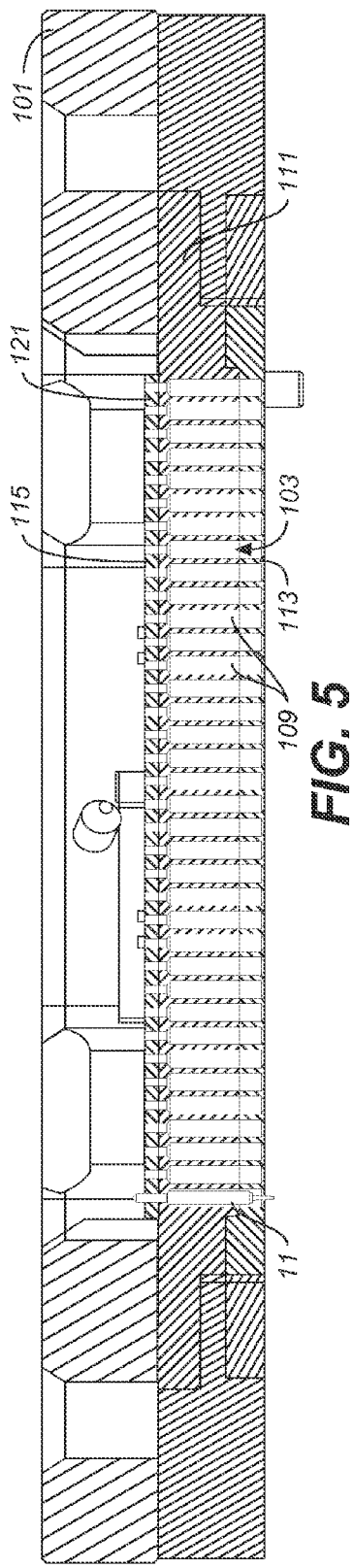
FIG. 5 is a cross-sectional view of a test socket showing a spacer insert for different chip package types and, for illustrative purposes, one spring contact pin in accordance with the invention loaded into a pin hole of the socket's interface wall.

Referring now to the drawings, FIGS. 1-4 illustrate an exemplary spring contact pin 11 in accordance the invention comprised of a cylindrical conductive spring barrel 13, conductive probe members 15, 17, and, as shown in FIG. 3, a compression spring 19 inside the spring barrel. Probe member 15 is seen to project from one of the barrel ends 21 (first barrel end) through a barrel end opening 23, whereas the opposite probe member 17 projects through the opposite end 25 (second barrel end) of the spring barrel through its barrel end opening 27. In the illustrated embodiment, probe member 15 is a depressible probe member, which can be depressed into and released from the spring probe barrel. Probe member 17, on the other hand, is a fixed probe member, which can, for example, be held in its fixed position in relation to the spring barrel by a suitable crimp (not shown) in the spring barrel wall at the barrel end 25.

As shown in FIG. 3, the depressible probe member 15 has an enlarged base end 34 captured within the spring barrel 13, and a projecting end 35, which extends from the captured base end through the spring barrel opening 23. The base end of the probe member has a diameter that is only slightly smaller than the inside diameter D of the spring barrel, such that the outer cylindrical wall 37 of the probe base is in contact with the barrel walls 39 to permit current flow between the barrel walls and the probe member. The back of the probe base can suitably be provided with a center extension member 41 having a diameter that allows one end of the barrel spring 19 to fit over the extension member. This extension member will act to center the compression spring, which contacts the rear shoulder 43 at the back end of the probe member.

The projecting end 35 of the probe member is seen to have sidewalls 36 that gradually taper from the probe's tip end 33 to a terminal point 45 within the spring barrel, where the probe begins to enlarge into the enlarged base end contained within the spring barrel. Referring to FIG. 3, it can be seen that such a gradual taper creates an enlarged gap between the inside wall 24 of the barrel end opening 23 that will prevent the projecting end of the probe from contacting the barrel end at any point during the compression and release cycle of the probe member. It is further seen that the barrel opening 23 is formed by an inwardly projecting portion 47 of the barrel end that forms interior seating walls 49, against which the forward shoulder 51 of probe base 34 seats when the probe member 15 is in its full, extended (released) position. Preferably, the forward shoulder 51 of the probe base has a radius 53 to facilitate the movement of the probe member in the spring barrel.

The taper of the projecting end 35 of probe member 15 preferably a substantially continuous taper and preferably causes the taper to increase in diameter substantially monotonically between the probe member's tip 33 and terminal point 45.

The invention also resides in part with the fixed probe member 17 opposite the depressible probe member 15. This fixed probe member is subjected to repeated test cycles where, with each test cycle, contact is made with a lead of a surface mount chip package of a device under test ("DUT"). The efficacy and durability of this probe end in a commercial test environment will be important to performance of the test socket.

In accordance with the invention, the fixed probe member 17 is provided with a tip end 30 having a conical surface 31 which forms a relatively large tip angle TA as compared to tip angles conventionally found in prior spring contact pins. The tip also terminates at a relatively sharp termination point 32. Preferably, the tip angle TA is about 90 degrees and the radius of the termination point 32 of the tip end is about 0.001 inches (0.0254 millimeters) or less. It is discovered that providing such a large tip angle on the contact pin's fixed probe member provides the pin with a robust probe end that operates reliably over a large number of test cycles as compared to spring contact pins having smaller tip angles (for example tip angles in the range of 45 degrees). The large tip angle also is better adapted for effective use with different surface mount chip packages, such as LGA, BGA and SGA packages, and better supports a sharp tip radius (point radius 32). A sharp tip radius will, in turn, provide for better penetration of oxide coatings and/or foreign material on the leads of the chip packages. It is contemplated the tip angle TA can vary about 15 degrees about the optimal angle of about 90 degree and still achieve the objects of the invention. Thus, in accordance with the invention, the tip end 30 will suitably have a tip angle TA in a range of between about 75 and 105 degrees. With a larger angle the penetrating ability of the tip will be compromised while at a smaller angle performance reliability after repeated used will suffer.

In another aspect of the invention, the length L2 of the fixed probe 17 from the barrel end 14 is set at about 0.050 inches (1.27 millimeters). This length is a critical length for achieving a spring contact pin having universal application, that is, a spring contact pin that enables z-axis loading of different surface mount packages types within the same test socket, as further described below. A length that is shorter than about 0.050 inches will be too short to make contact with different package types while a length is much longer than 050 inches will result in a longer signal path and consequently a degradation in high frequency signal integrity due to increased inductance. It is contemplated that a length greater than about 0.060 inches (1.52 millimeters) would exceed a suitable dimension for the fix probe 17 for acceptable electrical performance.

In still a further aspect of the invention, the interface wall of a test socket is provided with an improved configuration for retaining the universal spring contact pins of the invention. The test socket is generally denoted by the numeral 101 in FIGS. 5, 5A and 6. As best seen in the enlarged fragmentary view of FIG. 5A, the test socket includes an interface wall 103 having parallel top and bottom sides 105, 107, an array of pin retaining holes 109, a main wall section 111, and a pin retainer plate 113 removably affixed to the back of the main wall section for loading and holding spring contact pins in the pin retaining holes. Each of the pin retaining holes of interface wall 103 retains one of the previously described spring contacts 11, such that the fix probe member 17 of the pin projects above the top side 105 of the interface wall, and such that the depressible probe member projects below the interface wall's bottom side 107. Each of the pin holes 109 is seen to have an enlarged cavity portion 115 for capturing the spring barrel 13 of the spring contact pins, a small diameter probe through-hole 117 at the top of the interface wall, and a small diameter probe through-hole 119 in at the bottom of the interface wall. The fixed probe members of the retained spring contact pins extend through the top probe through-holes 117, and the depressible probe members 15 extend through the bottom through-holes 119.

In accordance with pin retention aspect of the invention, the diameter of the enlarged pin cavity is oversized in relation to the diameter of the pin barrel 13, producing particular performance advantages described below. However, because of their oversized diameter, the spring barrel cavity cannot be relied upon to hold the spring contact pins in a z-axis alignment, and thus to achieve a desired degree of pointing accuracy for contacting the leads a DUT package. In this aspect of the invention, pointing accuracy is achieved by sizing the diameter of the through-holes in close correspondence with the diameter of the fixed probe member so that z-axis alignment is maintained by the through-holes 117.

Figure 8:
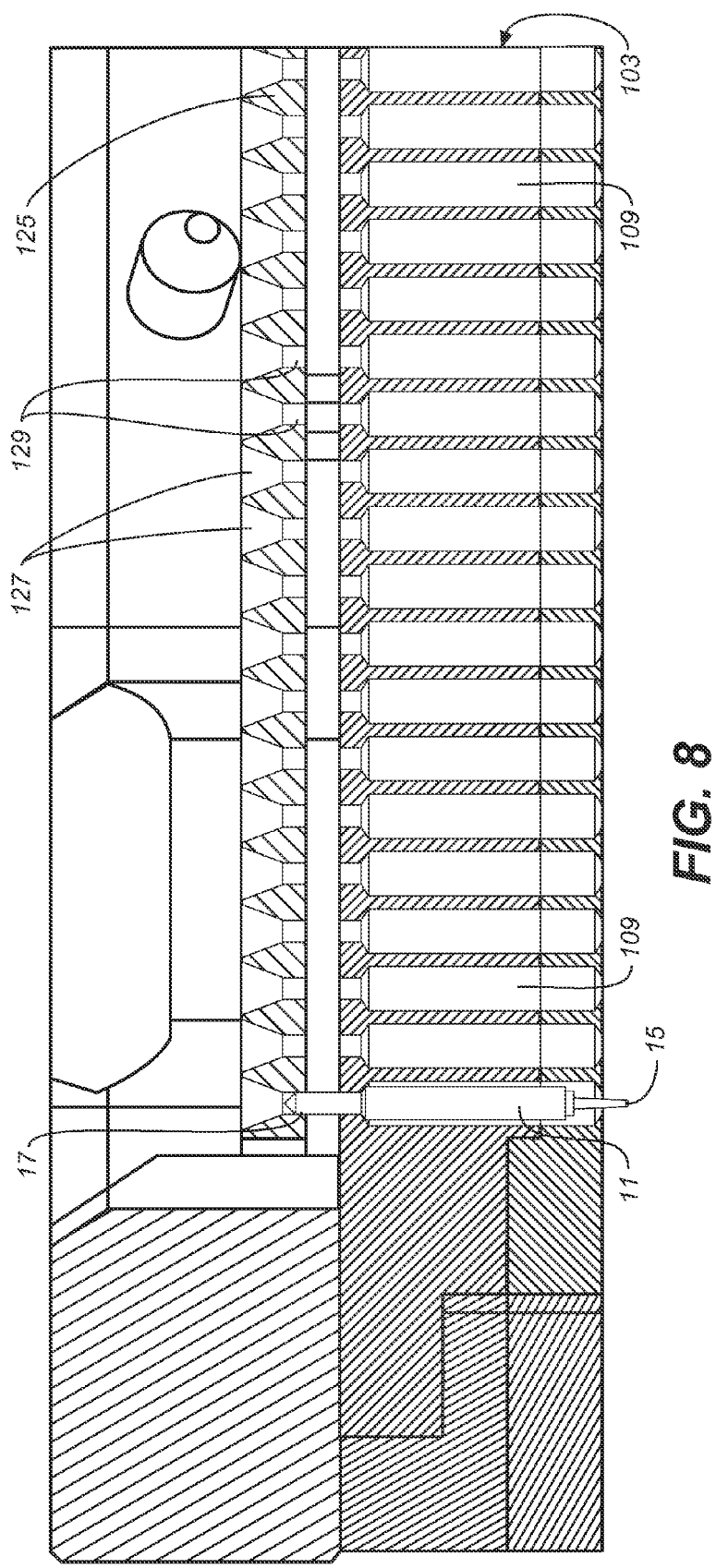
FIG. 8 is a cut-away cross-sectional view of a test socket showing a spacer insert for different chip package types and for illustrative purposes one spring contact pin in accordance with the invention.

It is noted that the length of the fixed probe members is chosen in the first instance to allow the spring contacts to be used in the testing of BGA devices where the test socket is normally provided with a floating BGA insert plate, such as shown in FIG. 8. As seen in FIG. 8 a floating insert plate 125 is provided above the sockets interface wall 111 for handling a BGA-type chip package. The fixed probe ends 17 of the contact pins 11 must be long enough to extend through probe through-holes 129 of the floating insert to contact and penetrate the surface of the solder ball leads of a BGA chip package, when the package is placed on the floating plate and the floating plate is depressed down onto the socket interface wall. (Flared top openings 127 are provided at the top of the through-holes receive the solder ball leads of a BGA chip package.)

Figure 5A:
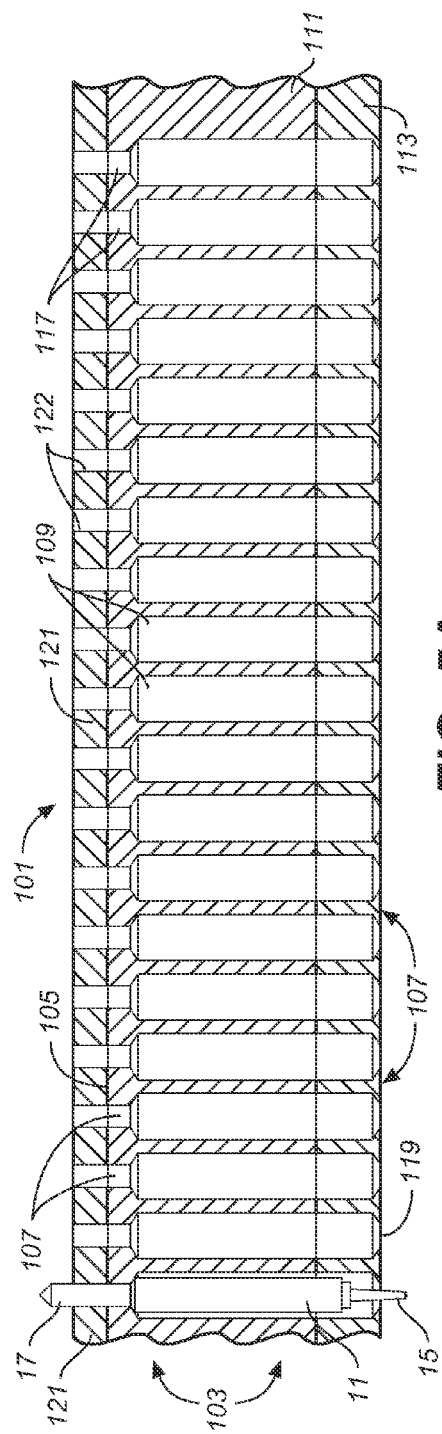
FIG. 5A is an enlarged fragmentary view thereof.
Figure 6:
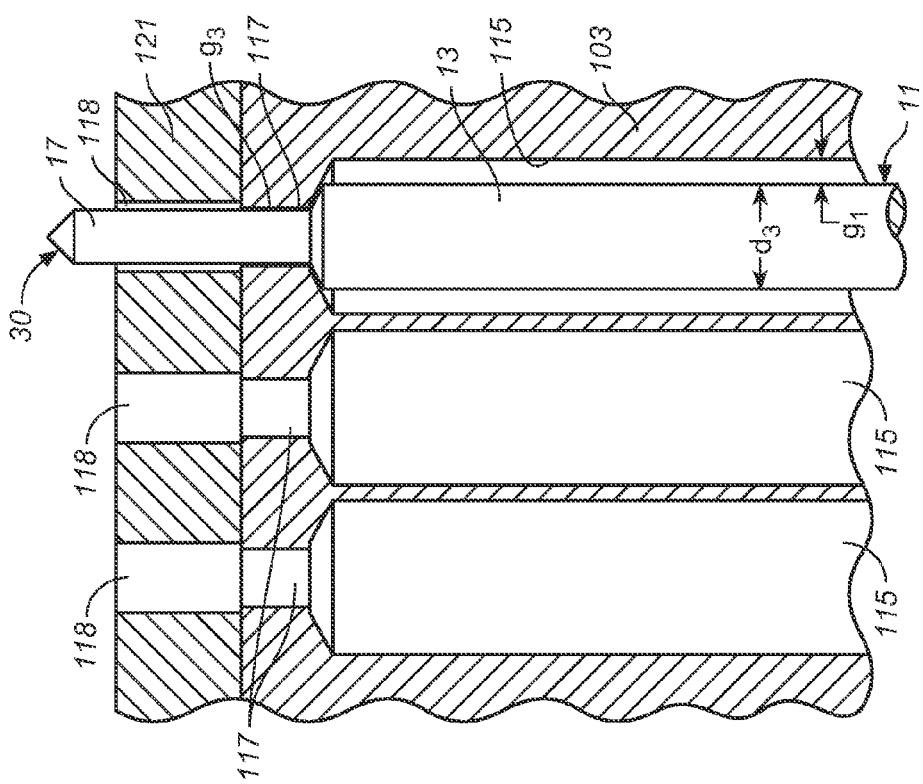
FIG. 6 is a further enlarged fragmentary sectional view thereof showing pin holes in the socket interface wall and an exemplary spring contact pin in accordance with the invention.

For testing of LGA and SGA packages, a floating insert is not used. To accommodate the long length of the contact pin's fixed probe member required for BGA testing applications, a chip package spacer plate 121 is supplied at the top side of the interface wall 111 as shown in FIGS. 5, 5A, and 6. This spacer plate has an array of probe through-holes 118 that align with the probe through-holes 117 in the socket interface wall when the spacer is placed on the top of the socket interface wall. (The diameter of the spacer through-holes can be slightly larger than the interface wall though-holes.) The thickness of the chip package spacer is chosen allow the fixed probe members 17 of the spring contact pins to extend through the spacer's through-holes 118 to contact and penetrate the surface of the leads of LGA or SGA packages loaded into the sockets, and thus the spacer thickness will depend on the package type.

Figure 7:
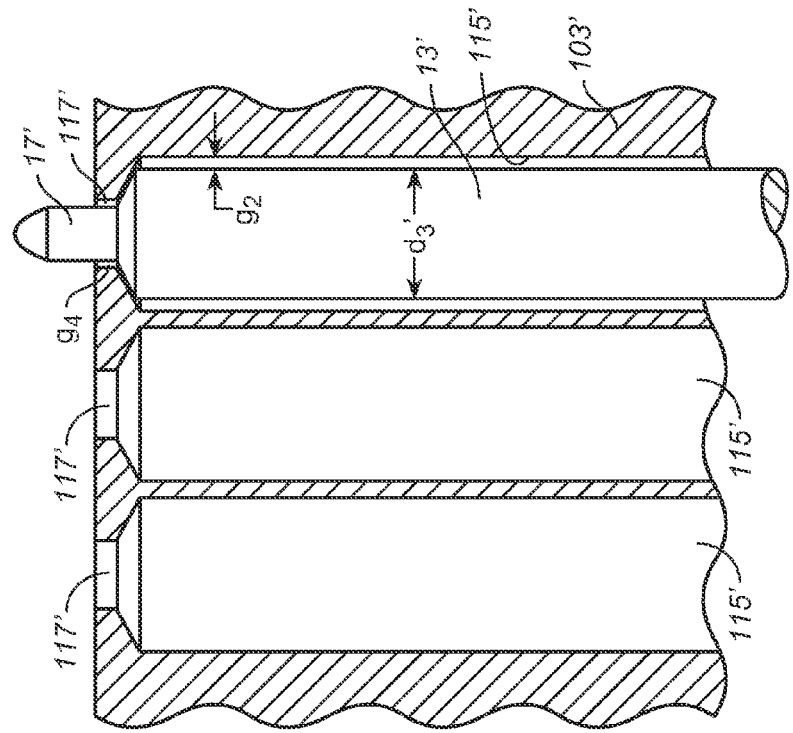
FIG. 7 is in illustration of a portion of a prior art test socket with and exemplary prior spring contact pin for providing a comparison to the contact pin retaining approach of the aspect of the invention illustrated in FIG. 6

FIGS. 6 and 7 provide a comparison of the pin retention approach used in the invention and conventional pin retaining strategies. Referring to these figures, it is seen that, because the pin retaining cavity 115 of the invention has a diameter that is relative large in relation to the diameter $d_3$ of the contact pin's spring barrel 13, a relatively large air gap $g_1$ is produced between the barrel and cavity walls. In FIG. 7, the air gap $g_2$ between the spring barrel 13' and barrel cavity 115' is comparatively small because, in the prior art, the diameter of the spring barrel $d_3'$ of the socket's contact pins is conventionally sized to closely correspond to the diameter of the barrel cavity 115'. A typical spring barrel air gap $g_2$ will be 0.0028 inches (2.8 mils). In accordance with this aspect of the invention, the barrel air gap is nearly doubled to about 0.0053 inches (5.3 mils). Air has a low dielectric constant, and enlarging the air gap around the pins can improve signal performance at high frequencies by improving the ability to maintain transmission line impedance continuity.

FIGS. 6 and 7 also illustrate the differences between a socket in accordance with the invention and the illustrated prior art socket as they related to the probe through-holes in the socket's interface wall. It is seen that the gap, $g_3$, between the through-hole 117 and the fixed probe member 17 shown in FIG. 6 is made to be very small as compared to the gap, $g_4$, between the probe through-hole 117' and fixed probe 17' shown in FIG. 7. The through-hole gap $g_3$ is made to be as small possible, suitably down to about 0.0005 inches (½ mil), whereas through-hole gaps ($g_4$) found in the prior art are typically in the range of 2-4 mils. Also, the through-holes 117 in the socket interface wall in FIG. 6 are substantially longer than the through-hole 117' shown in FIG. 7. The length of the through-holes 117 (FIG. 6) is suitably about 0.034 inches (34 mils), whereas the length of the through-hole 117' (FIG. 7) is typically about 0.004 inches (4 mils). As a consequence of the new described pin retaining approach, the spring contact pins 11 will be effectively held in z-axis alignment by the elongated through-hole 117, instead of by the barrel cavities 115. The new pin retention approach described and illustrated herein will minimize x-y plane displacements of the spring contact pins in the socket interface wall and improve pointing accuracy.

The following summarizes exemplary dimensions for the spring contact pin in accordance with the invention:

| | |
|---|---|
| Length of projection of depressible probe 15 (L1) | .0335" (0.85 mm) |
| Length of projection of fixed probe 17 (L2) | .050" (1.27 mm) |
| Length of spring barrel 13 (L3) | .1311" (3.33 mm) |
| Diameter of fixed probe 17 | 0.0098" (0.25 mm) |
| Diameter of spring barrel (d3) | 0.0150 (0.38 mm) |

The above dimensions produce a spring contact pin having an overall length of 0.2146 inches (5.45 mm) when the projecting end of probe member 15 is extended.

Suitable materials for the spring contact pin components are nickel or gold plated beryllium copper for spring barrel 13 and depressible probe member 15, and hardened SK4 steel for the fixed probe member 17. The probe member 17 is additionally preferably coated with a hardened PdCo alloy, and the barrel spring 19 is preferably a high temperature rated coil spring.

While the invention has described in considerable detail in the forgoing specification and the accompanying drawings, it will be understood that it is not intended that the invention be limited to such detail unless expressly indicated. It will be appreciated that embodiments of the invention other than illustrated and described would possible from the disclosure provided herein.

What we claim is:

1. A spring contact pin for an IC test socket comprising
   a spring barrel having a first barrel end and a second barrel end,
   a barrel spring in said spring barrel,
   a first conductive probe member projecting from the first barrel end of said spring barrel and being depressible into said spring barrel against said compression spring from a fully extended position to a compressed position, and
   a second conductive probe member projecting from the second barrel end of said spring barrel for making contact with a lead of a device under test (DUT), said second conductive probe member being non-depressibly fixed in relation to said spring barrel and including a tip end having a conical surface, said conical surface forming a tip angle for said tip end of between about 75 and 105 degrees and terminating at a termination point substantially centered at said tip end.

2. The spring contact pin of claim 1 wherein the tip angle of the tip end of said second probe member is about 90 degrees.

3. The spring contact pin of claim 1 wherein the termination point of the tip end of said second conductive probe member has a radius no greater than about 0.001 inches.

4. The spring contact pin of claim 1 wherein the projection length of said second conductive probe member from the second end of said spring barrel is no greater than about 0.060 inches and not less than about 0.050 inches.

5. The spring contact pin of claim 1 wherein the projection length of said second conductive probe member from the second end of said spring barrel is about 0.050 inches.

6. The spring contact pin of claim 5 wherein the length of said spring barrel is about 0.1311 inches, and wherein the projection length of said first conductive probe member from the first barrel end of said spring barrel is about 0.0335 inches.

7. A spring contact pin for an IC test socket comprising
   a spring barrel having a first barrel end and a second barrel end, said first barrel end having a barrel end opening,
   a barrel spring in said spring barrel,
   a first conductive probe member projecting from the first barrel end of said spring barrel and being depressible into said spring barrel against said compression spring from a fully extended position to a compressed position, said first conductive probe member having an enlarged base end captured within the spring barrel and a projecting end terminating at a probe tip, said projecting end extending from said base end through the barrel end opening at the spring barrel's first barrel end and having sidewalls that taper in the direction of said probe tip from a position within said spring barrel so as to prevent contact between the sidewalls of the probe members projecting end and the first barrel end of said spring barrel as the first probe member moves between its fully extended and compressed positions, and
   a second conductive probe member projecting from the second barrel end of said spring barrel for making contact with a lead of a device under test (DUT), said second conductive probe member being non-depressibly fixed in relation to said spring barrel and including a tip end having a conical surface, said conical surface forming a tip angle for said tip end of between about 75 and 105 degrees and terminating at a termination point substantially centered at said tip end.

8. The spring contact pin of claim 7 wherein the tip angle of the tip end of said second probe member is about 90 degrees.

9. The spring contact pin of claim 7 wherein the termination point of the tip end of said second conductive probe member has a radius no greater than about 0.001 inches.

10. The spring contact pin of claim 7 wherein the projection length of said second conductive probe member from the second end of said spring barrel is no greater than about 0.060 inches and not less than about 0.050 inches.

11. The spring contact pin of claim 7 wherein the projection length of said second conductive probe member from the second end of said spring barrel is about 0.050 inches.

12. The spring contact pin of claim 11 wherein the length of said spring barrel is about 0.1311 inches, and wherein the projection length of said first conductive probe member from the first barrel end of said spring barrel is about 0.0335 inches.

13. The spring contact pin of claim 7 wherein the sidewalls of the projecting end of said first probe member taper for substantially the entire length of said projecting end from the base end of the first probe member to the tip of the projecting end.

14. The spring contact pin of claim 7 wherein the sidewalls of the projecting end of said first probe member taper at substantially a uniform rate beginning at a position within said spring barrel.

15. The spring contact pin of claim 7 wherein the taper of the sidewalls of the projecting end of said first probe member begins substantially at the first probe member's enlarged base end and continues substantially to the tip thereof.

16. A spring contact pin for an IC test socket comprising
    a conductive spring barrel having a first barrel end and a second barrel end, said first barrel end having a barrel end opening formed by an inwardly projecting portion of said first barrel end, said inwardly projecting portion forming an inwardly projecting wall in the spring barrel at said first barrel end,
    a compression spring in said spring barrel,
    a first conductive probe member projecting from the first barrel end of said spring barrel and being depressible into said spring barrel against said compression spring from a fully extended position to a compressed position, said first conductive probe member having an enlarged base end captured within the spring barrel and a projecting end terminating at a probe tip having a radius, said enlarged base end having a forward shoulder that contacts the inwardly projecting wall at the first barrel end of said spring barrel when the first probe member is in its fully extended position, the projecting end of said probe member extending from the forward shoulder of said base end through the barrel end opening at the spring barrel's first barrel end and being tapered from the forward shoulder of the base end of the probe member to the radius of said probe tip, and a second conductive probe member projecting from the second barrel end of said spring barrel for making contact with a lead of a device under test (DUT), said second conductive probe member being non-depressibly fixed in relation to said spring barrel and including a tip end having a conical surface, said conical surface forming a tip angle for said tip end of between about 75 and 105 degrees and terminating at a termination point substantially centered at said tip end.

17. The spring contact pin of claim 16 wherein the length of said spring barrel is about 0.1311 inches, and wherein the projection length of said first conductive probe member from the first barrel end of said spring barrel is about 0.0335 inches, and the projection length of said second conductive probe member from the second end of said spring barrel is about 0.050 inches.

18. An IC test socket comprising
an interface wall having parallel top and bottom sides and an array of spring contact pin retaining holes, each of the spring contact pin retaining holes of said array of retaining holes having a cavity portion having a diameter, a first probe member through-hole communicating with said cavity portion from the bottom side of the interface wall, and a second probe member through-hole communicating with said cavity portion from the top side of the interface wall, and spring contact pins retained in the spring contact pin retaining holes of said interface wall, each of said spring contact pins being comprised of a spring barrel having a first barrel end, a second barrel end and a barrel diameter, and being captured in the cavity portion of one of said spring contact pin retaining holes, a barrel spring in said spring barrel, a first conductive probe member projecting from the first barrel end of said spring barrel, said first conductive probe member extending through the first probe member through-hole of the retaining hole of the interface wall in which the spring contact pin is retained and thence from the bottom side of said interface wall, and said first conductive probe member being depressible into said spring barrel against said compression spring from a fully extended position to a compressed position, and a second conductive probe member projecting from the second barrel end of said spring barrel for making contact with a lead of a device under test (DUT), and having a projection length, said second conductive probe member extending through the second probe member through-hole of the retaining hole of the interface wall in which the spring contact pin is retained and thence from the top side of said interface wall, and said second conductive probe member being non-depressibly fixed in relation to said spring barrel and including a tip end having a conical surface, said conical surface forming a tip angle for said tip end of between about 75 and 105 degrees and terminating at a termination point substantially centered at said tip end.

19. The IC test socket of claim 18 wherein the tip angle of the tip end of said second probe member is about 90 degrees.

20. The IC test socket of claim 18 wherein the termination point of the tip end of said second conductive probe member has a radius no greater than about 0.001 inches.

21. The IC test socket of claim 18 wherein the barrel diameter of the spring barrel of said spring contact pins is smaller than the diameter of the cavity portion of said spring contact pin retaining holes wherein an air gap is created between said spring barrel and the cavity portion of said spring contact pin retaining holes.

22. The IC test socket of claim 21 wherein the air gap between said spring barrel and the cavity portion of said spring contact pin retaining holes is at least about 0.0053 inches.

23. The IC test socket of claim 21 wherein the second probe member through-hole of said spring contact pin retaining holes has a diameter and the second probe member extending therethrough has diameter and wherein the diameters of said second through-hole and said second probe member are sized to allow the spring contact pins to be held in z-axis alignment by the spring contact pin retaining holes.

24. The IC test socket of claim 23 wherein the projection length of said second conductive probe member from the second end of said spring barrel is no greater than about 0.060 inches and not less than about 0.050 inches, and the second probe member through-hole of said spring contact pin retaining holes has a length to allow the spring contact pins to be held in z-axis alignment in the spring contact pin retaining holes.

25. The IC test socket of claim 23 wherein the length of the second probe member through-hole of said spring contact pin retaining holes is about 0.034 inches.

26. The IC test socket of claim 23 wherein a chip package spacer plate is provided at the top side of the interface wall, said spacer plate having an array of probe member through-holes that align with the second probe member through-holes of said contact spring pin retainer plate when the spacer plate is placed on the top side of said interface wall.

27. An IC test socket for testing IC chips having input/output leads, said IC test socket comprising
an interface wall having a top side which faces the leads of the IC chip being tested and a bottom side parallel to said top side, and further having an array of spring contact pin retaining holes, each of the spring contact pin retaining holes of said array of retaining holes having a cavity portion having cavity walls defining a diameter and a top probe member through-hole communicating with said cavity portion from the top side of the interface wall, said probe member through-hole having a diameter and a length, and spring contact pins retained in the spring contact pin retaining holes of said interface wall, each of said spring contact pins being comprised of a spring barrel having barrel ends and a barrel diameter and conductive probe members projecting for a projection length from the barrel ends of the spring barrel, said conductive probe members including a non-depressible conductive probe member extending through the top probe member through-hole of the spring contact pin retaining hole in which the spring contact pin is retained and thence from the top side of the interface wall of the IC test socket for making contact with leads of said IC chips, said non-depressible conductive probe member having a diameter, wherein the diameter of the barrels of said spring contact pins are smaller than the diameter of the cavity portions of the retaining holes in which the spring contact pins are retained such that a gap exists between the spring barrels and the cavity walls of the cavity portion of the retaining holes, and wherein the non-depressible conductive probe members of the spring contact pins have a diameter slightly smaller than the diameter of the of the top through-holes of the spring contact pin retaining holes such that the top through-holes hold the spring contact pins in z-axis alignment, and wherein said non-depressible conductive probe includes a tip end having a conical surface, said conical surface forming a tip angle for said tip end of between about 75 and 105 degrees and terminating at a termination point substantially centered at said tip end.

28. The IC test socket of claim 27 wherein said non-depressible conductive probe member has a projection length no greater than about 0.060 inches and not less than about 0.050 inches, and wherein the top probe member through-hole of said spring contact pin retaining holes has a length to allow the spring contact pins to be held in z-axis alignment in the spring contact pin retaining holes.

29. The IC test socket of claim 28 wherein the length of the top probe member through-hole of said spring contact pin retaining holes is about 0.034 inches.

* * * * *